(12) United States Patent
Yoon

(10) Patent No.: US 7,406,651 B2
(45) Date of Patent: Jul. 29, 2008

(54) FORWARD CHIEN SEARCH TYPE REED-SOLOMON DECODER CIRCUIT

(75) Inventor: Chan-ho Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 524 days.

(21) Appl. No.: 11/024,856

(22) Filed: Dec. 30, 2004

(65) Prior Publication Data

US 2005/0172208 A1 Aug. 4, 2005

(30) Foreign Application Priority Data

Jan. 29, 2004 (KR) .................. 10-2004-0005646

(51) Int. Cl.
*H03M 13/00* (2006.01)

(52) U.S. Cl. .................... 714/784
(58) Field of Classification Search ........... 714/784, 714/758
See application file for complete search history.

(56) References Cited

U.S. PATENT DOCUMENTS

| | | | | |
|---|---|---|---|---|
| 5,068,857 A | * | 11/1991 | Yoshida | 714/758 |
| 5,157,669 A | * | 10/1992 | Yu et al. | 714/758 |
| 5,323,402 A | * | 6/1994 | Vaccaro et al. | 714/782 |
| 6,209,115 B1 | * | 3/2001 | Truong et al. | 714/784 |
| 7,028,245 B2 | * | 4/2006 | Zhang | 714/784 |

FOREIGN PATENT DOCUMENTS

| | | |
|---|---|---|
| JP | 10135846 | 5/1998 |
| KR | P1999-004519 | 1/1999 |
| KR | 100202949 | 3/1999 |
| KR | 1020010058253 | 7/2001 |
| KR | 1020030013013 A | 2/2003 |

* cited by examiner

*Primary Examiner*—Shelly A Chase
(74) *Attorney, Agent, or Firm*—Volentine & Whitt, PLLC

(57) ABSTRACT

A Reed-Solomon decoder includes a Chien search circuit to receive an error location polynomial function, performs Chien search, and finds an error location; a Forney algorithm circuit to receives an error pattern polynomial function and find an error pattern; and, a seed generator circuit to indicates a seed value corresponding to a codeword length for the input data. A Chien search is performed to obtain and outputs exponential terms related to variables for the polynomials, wherein the Chien search is performed in the same computational direction as an order for the input data.

21 Claims, 10 Drawing Sheets

FORWARD CHIEN SEARCH TYPE REED-SOLOMON DECODER CIRCUIT

BACKGROUND OF THE INVENTION

1. Field of the Invention

The invention relates generally to a Reed-Solomon decoder circuit. More particularly, the invention relates to a forward Chien search type Reed-Solomon decoder circuit capable of performing a high speed cyclic redundancy check operation.

A claim of priority has been made to Korean Patent Application No. 2004-5646, filed on Jan. 29, 2004, the disclosure of which is hereby incorporated by reference in its entirety.

2. Description of the Related Art

Reed-Solomon (hereinafter, referred to as "RS") code is a kind of Bose-Chaudhuri-Hocquenghem (hereinafter, referred to as "BCH") code and is a linear block code. RS code is a kind of a block error correction code and is widely used in applications such as digital data communication and data storage. For example, RS code has found application in such varied products as hard disk drives (HDD), CDs, DVDs, barcodes, wireless and mobile communication systems, satellite communication systems, and digital television.

The need for error correction coding arises from the inevitable data or signal noise or data errors which result whenever data is stored to physical medium or transmitted over an imperfect communications channel. An RS encoder receives original data in a predetermined block format and adds redundant bits to the data to generate a codeword. An RS decoder receives the encoded data and related parity check data and recovers the original data when an error occurs because of transmission or storage.

FIG. 1 schematically shows a general error check and correction (hereinafter referred to as ECC) system associated with a data storage device. FIG. 1 shows an ECC system 100 for checking and correcting an error in data read or received by a data storage device. In general, the data storage device has an input port (NRZ IN) 12 and an output port (NRZ OUT) 14 forming respective date transmission channel interfaces. The data storage device has a buffer input port (BUF IN)16 and a buffer output port (BUF OUT) 18 forming separate buffer interfaces to (e.g.,) a memory storage core.

Assuming this general structure, and further assuming use of a cyclic redundancy check (hereinafter, referred to as CRC), ECC system comprise a CRC encoder 108 and an RS encoder 104 which respectively generate parity checks for data received through buffer input port BUF IN 16. In the case of decoding, forward error correction (hereinafter, referred to as "FEC") is performed on the data transferred through the input port 12. A signal input through the input port 12 is transferred to both an RS decoder 102 and a CRC decoder 110. RS decoder 102 calculates a syndrome for the input signal, and CRC decoder 110 calculates a CRC operation value for the input signal.

If any one of the syndromes calculated by RS decoder 102 is not zero, a modified Euclid algorithm (hereinafter, "MEA") unit 112 within RS decoder 102 calculates an error location polynomial (hereinafter, referred to as "ELP") and an error pattern polynomial (hereinafter, referred to as "EPP") using a competent MEA. MEA unit 112 outputs the calculation result to both a Chien search circuit 114 and a Forney algorithm circuit 116. The Chien search circuit 114 and the Forney algorithm circuit 116 perform Chien search and a Forney algorithm on an output signal from MEA unit 112, respectively. Chien search circuit 114 finds an error location for the transferred data using the Chien search, and Forney algorithm circuit 116 obtains an error pattern for the transferred data using the Forney algorithm. In order to check for a missed error correction after RS decoding, a CRC decoder 118 performs an additional CRC decoding using the error location and the error pattern obtained after RS decoding. If there is no error in the RS decoding result and the CRC decoding result, data is output through buffer output port 18.

FIG. 2 illustrates the operation of RS decoder 102 in some additional detail. Referring to FIG. 2, RS decoder 102 begins with obtaining a syndrome of a codeword for data r(x) received by the data storage device. A syndrome generator circuit 202 generates a syndrome polynomial S(x). If all the calculated syndromes are zero, an additional RS decoding is not performed. If the CRC operation value for the codeword is zero, it is ultimately determined that no error is found in the received data. If, however, the obtained syndrome is not zero, RS decoding is performed. At this time, the MEA unit 206 performs a MEA using error mode and erasure mode. The MEA unit 206 receives syndrome polynomial S(x) and an erasure polynomial λ(x) generated by an erasure generator 204, obtains an ELP σ(x) and an EPP ω(x), and outputs the ELP σ(x) and the EPP ω(x) to a Chien search circuit 208 and a Forney algorithm circuit 210 respectively. Chien search circuit 208 obtains an error location by performing a Chien search using the ELP σ(x) obtained following application of the MEA. Forney algorithm circuit 210 obtains an error pattern by applying the Forney algorithm using the EPP ω(x) obtained following application of the MEA.

Returning to FIG. 1, ECC system 100 also includes an additional CRC operator 120 to reduce miss-correction by RS decoder 102. This is accomplished by the CRC operator 120 performing a CRC encoding on data received from input port 12. CRC operator 120 includes a first CRC decoder 110 and a second CRC decoder 118. First CRC decoder 110 decodes data received from input port 12. Second CRC decoder 118 decodes data using the error location and the error pattern. First CRC decoder 110 receives a signal input through the input port 12 and performs CRC decoding on the received data. Second CRC decoder 118 performs CRC decoding using the error location and the error pattern obtained after RS decoding is performed. Where the CRC operation value for the data input through input port 12, as obtained by first CRC decoder 110, is identical to the CRC operation value for the error location and the error pattern obtained by the second CRC decoder 118, it is determined that no CRC error is found. As RS decoding is performed symbol by symbol, the first and second CRC decoders should operate symbol by symbol as well.

FIG. 3 shows one data format used widely for data stored in contemporary storage devices. Referring to FIG. 3, the data format includes a 512 byte data sector, a 2 byte embedded sector number (ESN), 4 bytes reserved for CRC operation, and 80 bytes reserved for RS operation. As noted, RS decoding and CRC decoding by the second CRC decoder are typically performed symbol by symbol. The RS decoder uses ELP(σ(x)) and EPP(ω(x)) as initial coefficients when implementing the Chien search and the Forney algorithm. When ELP(σ(x)) and EPP((ω(x)) are used as initial coefficients, the RS decoder should perform Chien search in a reverse order of receiving a message. Accordingly, the conventional RS decoder should store an error location and an error pattern and input the error location and the error pattern to the CRC decoder in a reverse order for the successive CRC operation.

SUMMARY OF THE INVENTION

Embodiment(s) of the invention provide an Reed-Solomon decoder that makes an order of receiving data be same as an order of a Chien search so as to reduce the aggregate time required to perform overall error check and correction operation.

Thus, one embodiment of the invention provides a Reed-Solomon decoder, comprising; a Chien search circuit to receive an error location polynomial function, perform a Chien search, and find an error location, a Forney algorithm circuit to receive an error pattern polynomial function and find an error pattern by application of a Forney algorithm, and a seed generator circuit to indicate a seed value corresponding to a codeword length for input data when the Chien search is performed, and to thereby obtain and output exponential terms related to variables associated with the polynomials, wherein the Chien search is performed in the same computational direction as an order of the input data.

In a related embodiment, the seed generator circuit is connected to the Chien search circuit and the Forney algorithm circuit either in parallel or serially.

In yet another related embodiment, the seed value output by the seed generator circuit and polynomial arrays output by the Chien search circuit and the Forney algorithm circuit are sequentially multiplied by a Galois Field (GF) multiplier circuit.

In still another embodiment, the Chien search circuit and the Forney algorithm circuit respectively multiply a calculation value obtained by the seed generator circuit by polynomial coefficients corresponding to an array of the calculation values in the same computational direction as the input order of the codeword to obtain multiplication results, and thereafter set the multiplication results as a new coefficients for data input to the Chien search circuit and the Forney algorithm circuit, to thereby obtain an error location and an error pattern in a forward direction.

In another embodiment, the invention provides a Reed-Solomon decoder comprising; a syndrome generator circuit to generate a syndrome polynomial from input data, an erasure generator circuit to receive the syndrome polynomial and a TA flag and to generate an erasure polynomial, a modified Euclid algorithm (MEA) circuit to receive the syndrome polynomial and the erasure polynomial, and to output an error location polynomial function and an error pattern polynomial function, a Chien search circuit to receive the error location polynomial function, to perform a Chien search, and find an error location, a Forney algorithm circuit to receive the error pattern polynomial function and find an error pattern by application of a Forney algorithm, and a seed generator circuit to generate a Galois Field (GF) value when the Chien search is performed, and indicate a seed value corresponding to a codeword length.

In different yet related embodiments, (1) the seed generator circuit comprises a GF multiplier circuit that sequentially multiplies the seed value, such that the seed generator circuit obtains exponential terms related to variables associated with the polynomials; (2) the Chien search circuit multiplies a calculation value obtained by the seed generator circuit with coefficients derived from the error location polynomial corresponding to an array of the calculation values in the same computational direction as an input order of the codeword in order to obtain an error location; and, (3) the Forney algorithm circuit multiplies a calculation value obtained by the seed generator circuit with coefficients derived from the error pattern polynomial corresponding to an array of the calculation values in the same computational direction as an input order of the codeword in order to obtain an error pattern.

In yet another embodiment, the invention provides an error check and correction circuit, comprising; a Reed-Solomon decoder including a Chien search circuit, a Forney algorithm circuit and a seed generator circuit, and a cyclic redundancy check (CRC) operator circuit to determine miss-correction of an error by the Reed-Solomon decoder, wherein the Chien search circuit receives an error location polynomial function, performs Chien search, and finds an error location, the Forney algorithm circuit receives an error pattern polynomial function, and finds an error pattern by application of a Forney algorithm, and the seed generator circuit providing a seed value corresponding to a codeword length for input data when the Chien search is performed, and obtaining and outputting exponential terms for the polynomials, wherein the Chien search is performed in the same computational direction as an order for the input data, and whenever an error pattern value for an error location is generated in the Chien search, the error pattern value is input to the Chien search so that a CRC operation is simultaneously performed.

In still another embodiment, the invention provides a method of checking and correcting an error in input data, the method comprising; generating an error location polynomial from the input data, generating an error pattern polynomial from the input data, sequentially multiplying a seed value corresponding to a codeword related to the input data, and calculating variable terms of the polynomials, performing a Chien search based on the error location polynomial and the seed value to obtain an error location, applying a Forney algorithm in relation to the error pattern polynomial and the seed value to obtain an error pattern, and correcting the error in the input data in relation to the error location and the error pattern.

In related aspects, this embodiment may be further modified such that the CRC operation is performed using the error location and the error pattern, and/or the Chien search is performed in the same computational direction as an received direction for the input data.

In still another embodiment, the invention provides a method of implementing Reed-Solomon (RS) coding, comprising, performing cyclic redundancy check (CRC) following RS decoding, wherein the RS decoding comprises a Chien search resulting in proper coefficient selection in relation to a codeword related to input data, whereby the Chien search is performed in a computational direction consistent with an received order for the input data.

In this method is the Chien search and the CRC operation may be executed simultaneously.

BRIEF DESCRIPTION OF THE DRAWINGS

Embodiments of the invention are described hereafter with reference to the attached drawings in which.

DETAILED DESCRIPTION OF THE INVENTION

The invention will now be described in some additional detail with reference to the accompanying drawings, in which exemplary embodiments of the invention are shown. The invention may, however, be embodied in many different forms and should not be construed as being limited to only the embodiments set forth herein.

In one exemplary RS decoding method according to the invention, when a Chien search is performed, an initial coefficient is determined using a proper coefficient corresponding to codeword length and the Chien search is performed according to the input order of data. If this method is used, whenever an error pattern value for an error location is generated in a Chien search, since the error pattern value can be input to a CRC decoder, the CRC operation can be performed at the same time that the Chien search is performed. In addition, since the execution order for the CRC operation and Chien search are the same relative to the order of data input, an error location and an error pattern do not have to be stored for proper application within the integral computational operations for the ECC system. Thus, one aspect of the invention, RS decoding is characterized by setting a proper coefficient before executing the Chien search.

Figure 1:
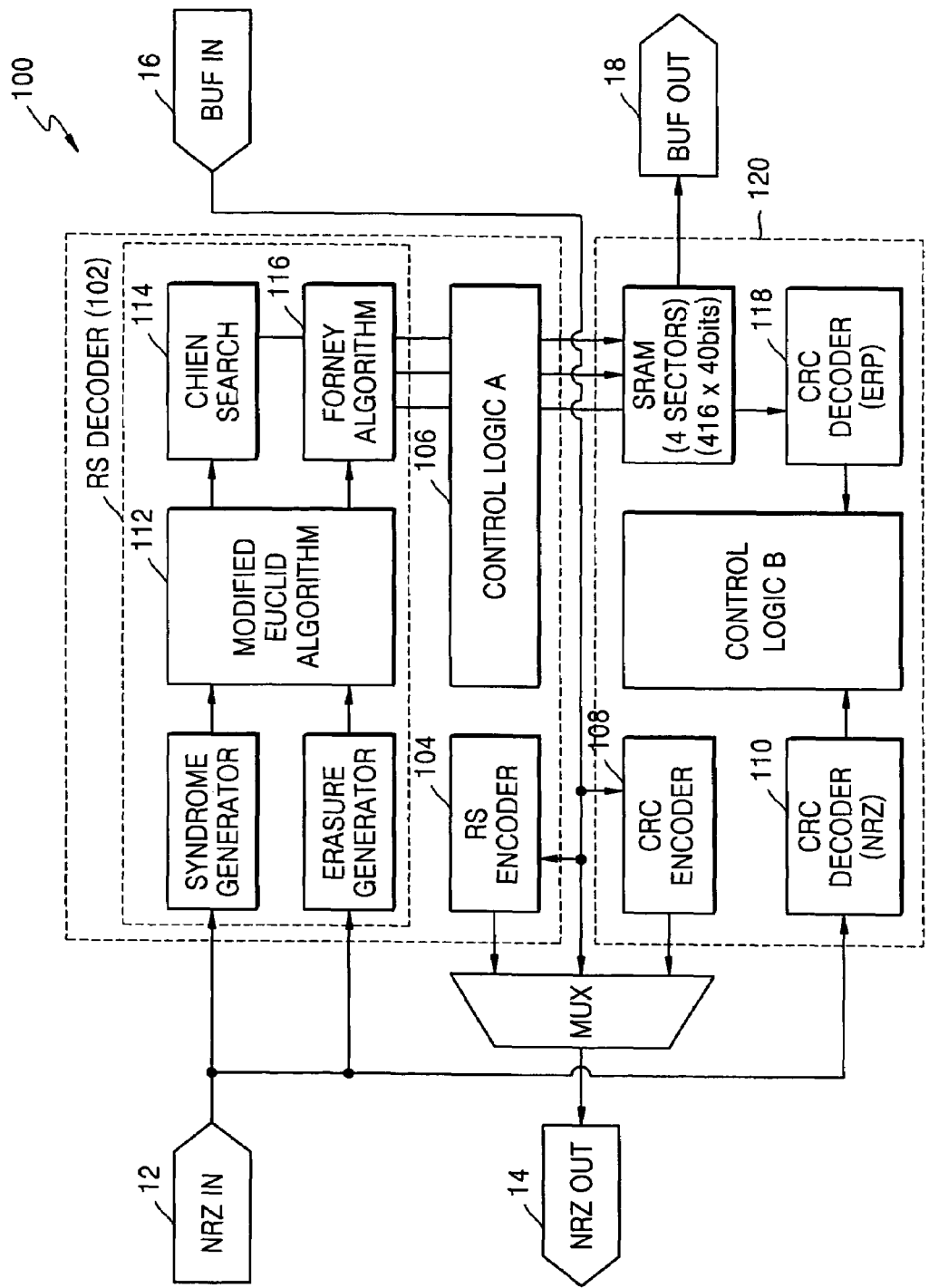
FIG. 1 schematically shows a general ECC system.
Figure 2:
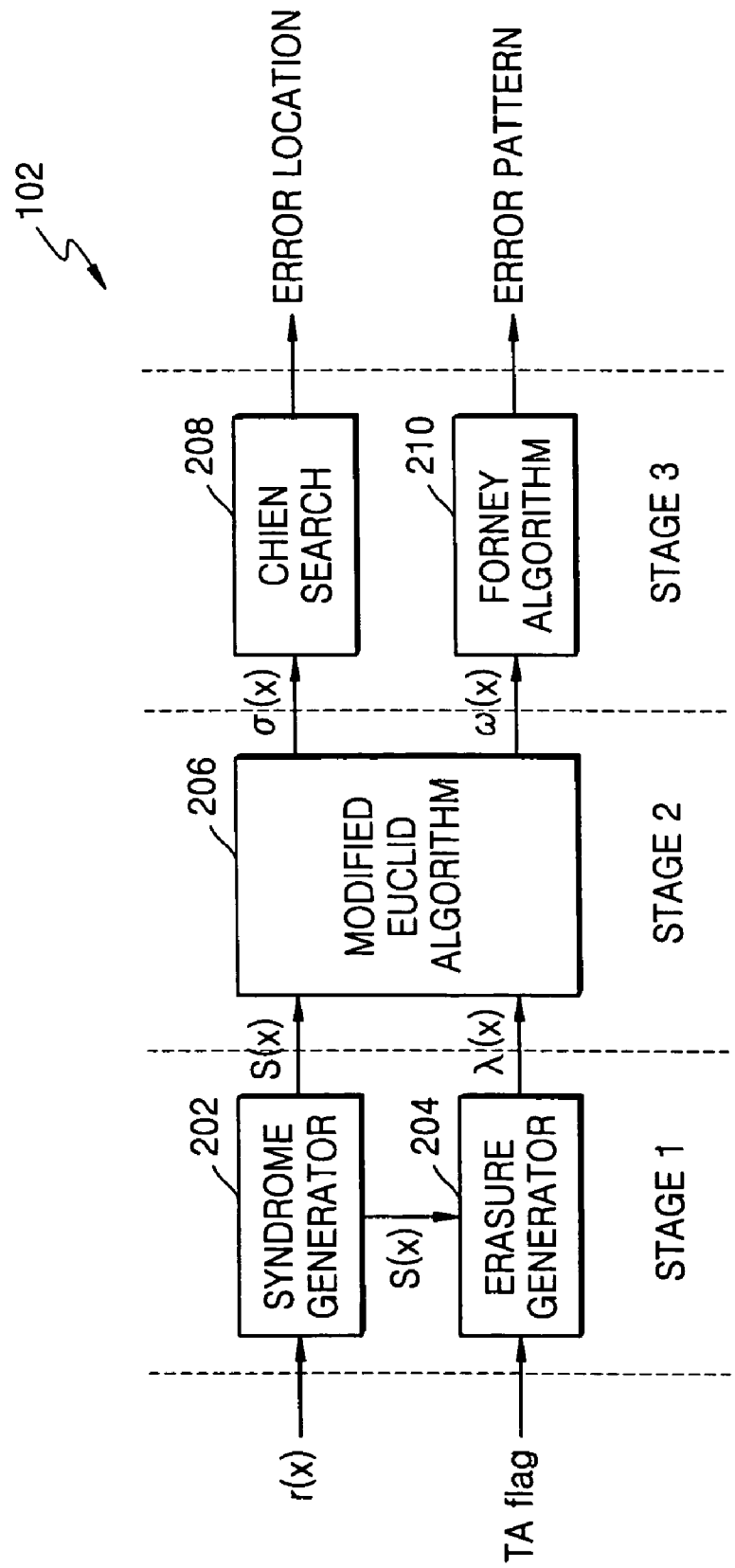
FIG. 2 shows a Reed-Solomon decoder of FIG. 1.
Figure 3:
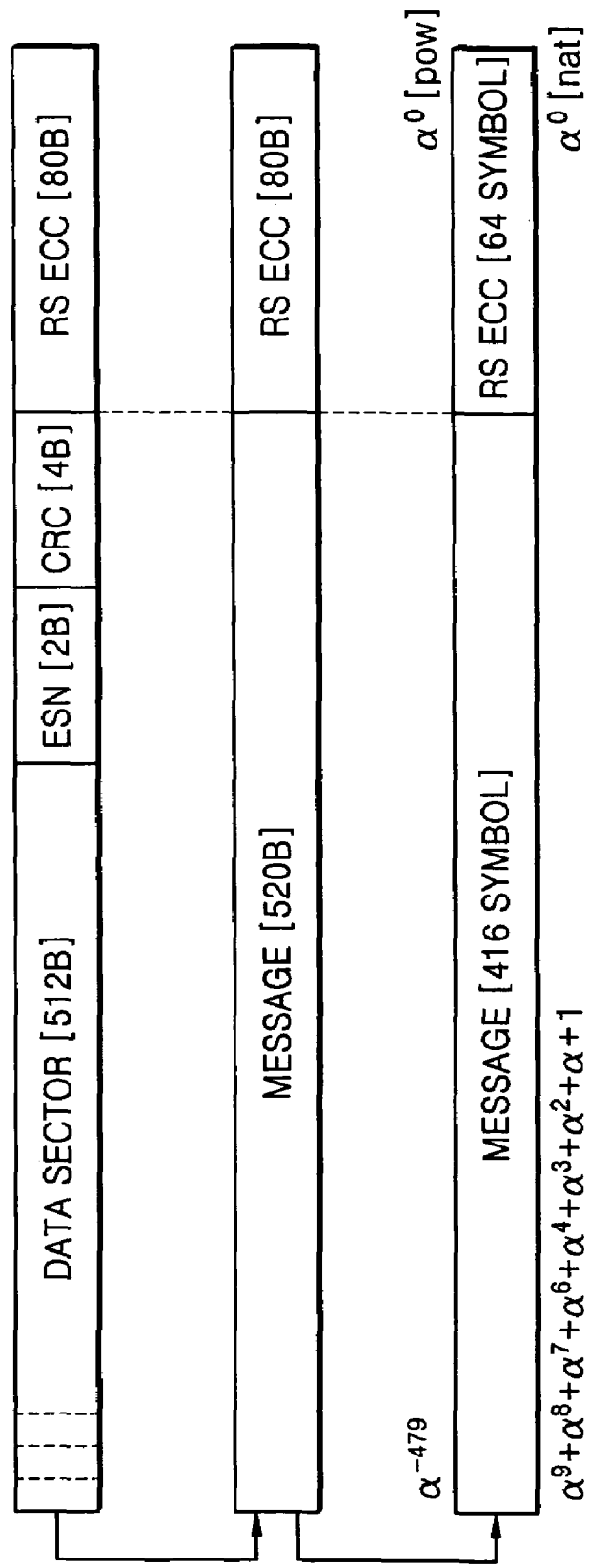
FIG. 3 shows a data format used widely for a storage device.
Figure 4:
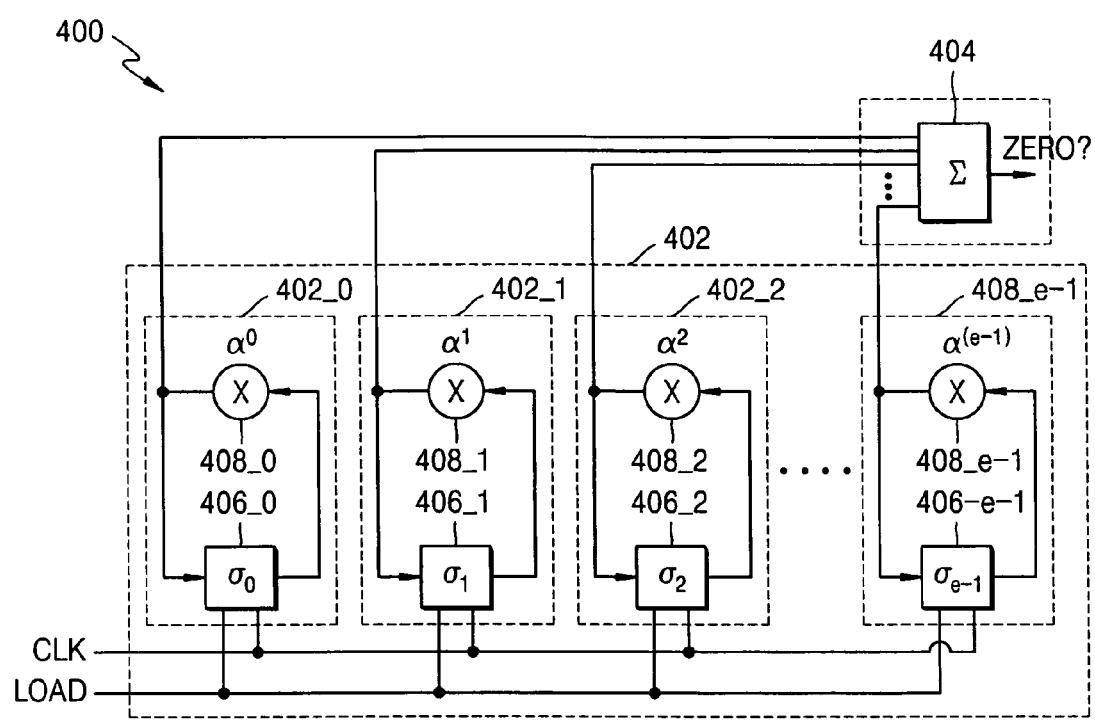
FIG. 4 shows a general Chien search circuit.

FIG. 4 further illustrates a general Chien search circuit. In the illustrated example, Chien search circuit 400 includes a polynomial calculation circuit 402 and an adder circuit 404. Polynomial calculation circuit 402 includes in one embodiment a plurality of sub-modules $402\_0, 402\_1, 402\_2, \ldots, 402\_e\text{-}1$ corresponding to the terms of an ELP $\sigma(x)$. Each sub-module $402\_0, 402\_1, 402\_2, \ldots, 402\_e\text{-}1$ respectively includes an adder circuit $406\_0, 406\_1, 406\_2, \ldots, 406\_e\text{-}1$ and a multiplier $408\_0, 408\_1, 408\_2, \ldots, 408\_e\text{-}1$.

Chien search circuit 400 loads coefficients associated with an ELP to a respective one of adder circuits 406 in synchronization with a loading signal (LOAD). Each of the multiplier circuits 408 of Chien search circuit 400 multiplies a given ELP $\sigma(x)$ coefficient of the with respective seed value $\alpha$. Herein, respective seed values, $\alpha$, are repeatedly multiplied to ELP $\sigma(x)$ coefficients in synchronization with a clock signal (CLK). The corresponding multiplicative products are used to set (update) the ELP $\sigma(x)$ coefficients and then applied to adder circuit 404 in synchronization with every clock signal. The position having a result value of '0' is determined to be the error location. An error correction is performed for data corresponding to this error location.

Figure 5:
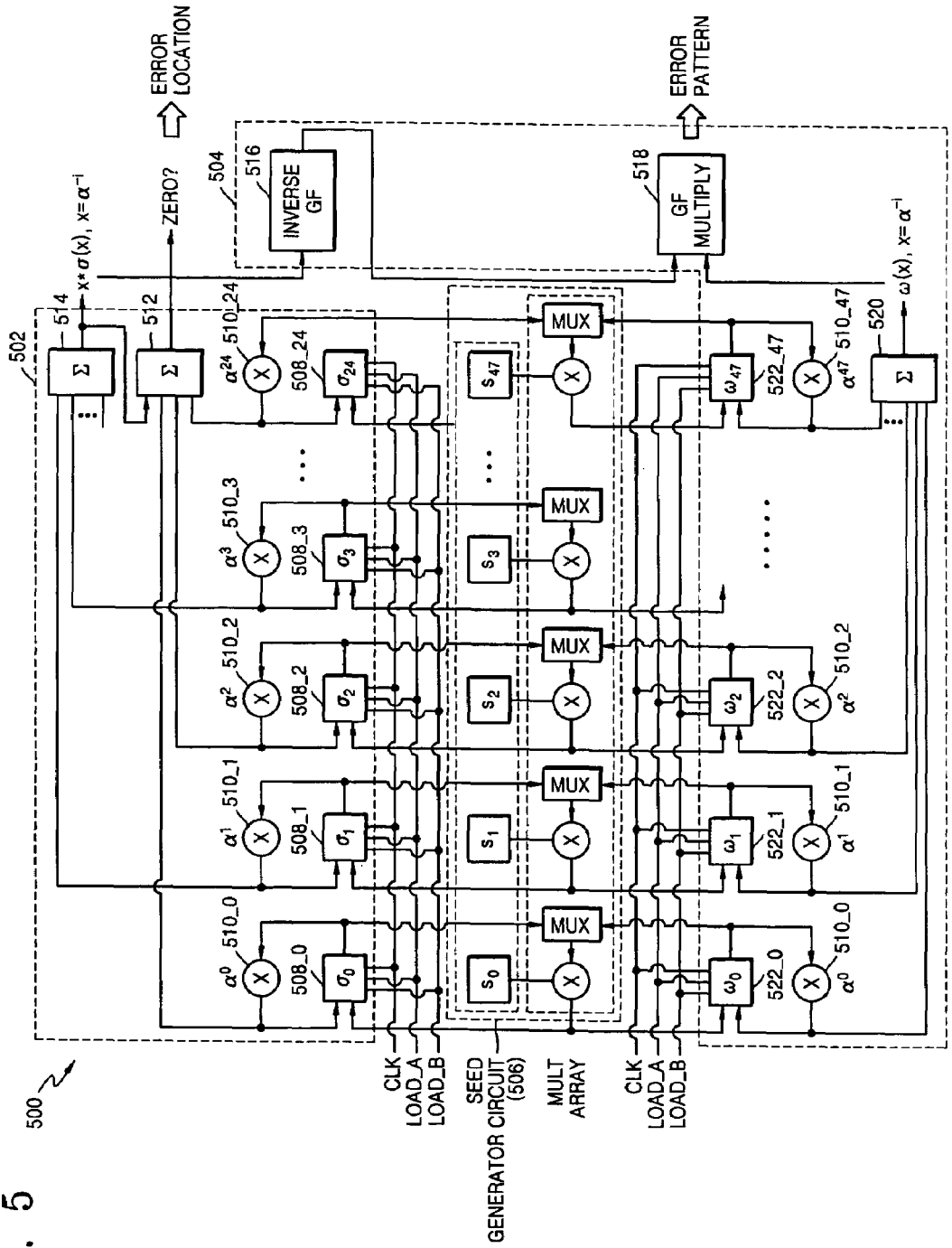
FIG. 5 shows a portion of a Reed-Solomon decoder according to an embodiment of the present invention.

FIG. 5 shows a portion of a Reed-Solomon decoder according to one embodiment of the invention. An RS decoder 500 includes a Chien search circuit 502, a Forney algorithm circuit 504 and a seed generator circuit 506. The Chien search circuit 502 is configured as shown in FIG. 4, but supports a forward Chien search through an additional seed value generator circuit 506.

The Chien search and Forney algorithm are applied in a method adapted to find an error location and an error pattern using an ELP $\sigma(x)$ and EPP $\omega(x)$. Rather than being applied separately, the Chien search and Forney algorithm are applied together. Thus, Chien search circuit 502 and Forney algorithm circuit 504 of RS decoder 500 find the error location and the error pattern simultaneously.

When a MEA is employed in RS decoder 500, the ELP $\sigma(x)$ is an equation having roots related to the inverse of the error location. In other words, RS decoder 500 finds the roots of the ELP equation and takes the inverse of the roots in order to find the actual error location. In general, since the ELP is a high order equation, it is not easy to find the roots of the ELP equation. However, in the Chien search algorithm, all the Galois field elements may be substituted, and then a determination thereafter made as to whether the ELP equation is satisfied. Thus, it is relatively easy to find the roots of the high order ELP equation. In other words, the Chien search algorithm is used to find the roots of the equation:

$$\sigma(x)=\sigma_0+\sigma_1 x+\sigma_2 x^2+\ldots+\sigma_{e-2}x^{e-2}+\sigma_{e-1}x^{e-1}=0.$$

For example, supposing that $\sigma(x)=\sigma_0+\sigma_1 x+\sigma_2 x^2+\sigma_3 x^3$, then $\sigma_0$, $\sigma_1$, $\sigma_2$ and $\sigma_3$ can be obtained using the MEA circuit referenced above. Herein, supposing that $\sigma_0=\alpha^{100}$, $\sigma_1=\alpha^{200}$, $\sigma_2=\alpha^{300}$ and $\sigma_3=\alpha^{400}$, the ELP output from the MEA circuit is $\sigma(x)=\alpha^{100}+\alpha^{200}x+\alpha^{300}x^2+\alpha^{400}x^3$.

If the codeword length is 462, $\alpha$'s from $\alpha^{-461}$ to $\alpha^0$ are subsequently substituted for x, and the value of x that produces an equation result of zero is found. For a forward Chien search, the equation is first calculated for $x=\alpha^{-461}$ and then the equation is calculated in the order of $x=\alpha^{-460}$, $x=\alpha^{-459}, \ldots, x=\alpha^0$.

Meanwhile, the seed value generator circuit 506 obtains the results of the equation beforehand by substituting $\alpha^{-461}$ for x, $x^2$, and $x^3$ when the equation is calculated for $x=\alpha^{-461}$. As the result, arrays of ELPs for the Chien search circuit 502 are $\alpha^{100}$, $\alpha^{200}$, $\alpha^{300}$ and $\alpha^{400}$, respectively. The arrays of the seed value generator circuit 506 are 1, $\alpha^{-461}$, $(\alpha^{-461})^2$ and $(\alpha^{-461})^3$. The coefficients $\alpha^{100}$, $\alpha^{200}$, $\alpha^{300}$ and $\alpha^{400}$ of the ELP are input to adder circuits $508\_0$ through $508\_3$ shown in FIG. 5 respectively. Values of 1, $\alpha^{-461}$, $(\alpha^{-461})^2$ and $(\alpha^{-461})^3$ calculated by the see value generator circuit are input to the multipliers $510\_0$ through $510\_3$ respectively. Accordingly, if each digit of each array is multiplied, new initial coefficients of the final ELP can be obtained. If the value obtained by first adder circuit 512 is zero, the location is determined as error location.

Chien search circuit 502, as shown in the example of FIG. 5, divides a polynomial into even-order terms and odd-order terms and executes calculations using a first adder circuit 512 and a second adder circuit 514. First adder circuit 512 adds all the order terms as the adder circuit 404 shown in FIG. 4. Second adder circuit 514 adds only odd-order terms of the ELP to separately obtain $x^*\sigma'(x)$ ($x=\alpha^{-1}$). It is used to simultaneously perform the Chien search algorithm and Forney algorithm. The odd-order terms based polynomial added by second adder circuit 514 is input to a GF multiplier circuit 518 through an inverse GF 516 for the Forney algorithm.

Forney algorithm circuit 504 is a circuit determining an error pattern using ELP($\sigma(x)$) and EPP($\omega(x)$). The Forney algorithm can be represented as follows.

$$e(x) = \frac{\omega(x)}{x * \sigma'(x)}$$

where $x=\alpha^{-1}$, and $\sigma'(x)$ is a derivative function of $\sigma(x)$, which is obtained by differentiating $\sigma(x)$. $\sigma(x)$ and $\sigma'(x)$ are defined as follows:

$$\sigma(x) = \sigma_0 + \sigma_1 x + \sigma_2 x^2 + \ldots + \sigma_{e-2} x^{e-2} + \sigma_{e-1} x^{e-1}$$

$$\sigma'(x) = \sigma_1 + 2\sigma_2 x + 3\sigma_3 x^2 + 4\sigma_4 x^3 + 5\sigma_5 x^4 + \ldots + (e-2)\sigma_{e-2} x^{e-3} + (e-1)\sigma_{e-1} x^{e-2}$$

$$= \sigma_1 + \sigma_3 x^2 + \sigma_5 x^4 + \ldots$$

Therefore, $x*\sigma'(x) = \sigma_1 x + \sigma_3 x^3 + \sigma_5 x^5 + \ldots$.

Accordingly, the denominator $x*\sigma'(x)$ of the Forney algorithm is the value used to calculate only odd-terms of $\sigma(x)$.

The adder circuits 522_0, 522_1, 522_2, 522_3, ... of Forney algorithm circuit 504 shown in FIG. 5 load the coefficients of the error pattern polynomial $\omega(x)$ obtained as a result of the MEA calculation. That is, arrays $\omega_0, \omega_1, \omega_2, \omega_3, \ldots$ of the error pattern polynomial are loaded into respective adder circuits 522_0, 522_1, 522_2, 522_3 ... in synchronization with a loading signal (LOAD). The multiplier circuits 524_0, 524_1, 524_2, 524_3, ... of Forney algorithm circuit 504 calculate $(\alpha^{-i})^0, (\alpha^{-i})^1, (\alpha^{-i})^2, (\alpha^{-i})^3, \ldots$ as obtained value generator circuit 506 (e.g., where the codeword length is 462, value inputs ranging from $\alpha^{-461}$ are input).

Then, third adder circuits 520 multiply an array derived from the EPP of the Forney algorithm circuit 504 with the generated seed value array according to corresponding digits, sets a new initial coefficient, and adds the values obtained by multiplication according to corresponding digit through adder circuits 522_0, 522_1, 522_2, ... and multiplier circuits 524_0, 524_1, 524_2, ....

An inverse GF circuit 516 obtains 1024 (=$2^{10}$) inverse fields beforehand, and stores the inverse fields using a table lookup method in one cycle if, for example, a symbol is 10 bits. Second adder circuit 514 receives $x*\sigma'(x)$ and outputs an inverse of GF, that is, $(x*\sigma'(x))^{-1}$, $x=\alpha^{-i}$.

GF multiplier circuit 518 receives an inverse of $x*\sigma'(x)$ ($x=\sigma^{-i}$) obtained by second adder circuit 514 (that is, an output of inverse GF circuit 516) and $\omega(x)$ ($x=\alpha^{-i}$) obtained by third adder circuit 520, and multiplies the inverse of $x*\sigma'(x)$ ($x=\alpha^{-i}$) and the $\omega(x)$ ($x=\alpha^{-i}$) in order to obtain a final error pattern. In other words, inverse GF circuit 516 outputs an inverse of $x*\sigma'(x)$, and GF multiplier circuit 518 divides $\omega(x)$ by $x*\sigma'(x)$ to obtain the error pattern.

According to one embodiment of an RS decoding method according to the invention, as illustrated by the example shown in FIG. 5, when the Chien search is performed, initial coefficients are substituted as proper coefficients corresponding to codeword length so that the Chien search can be performed in an input order consistent with an input order for the data being operated upon.

Figure 6:
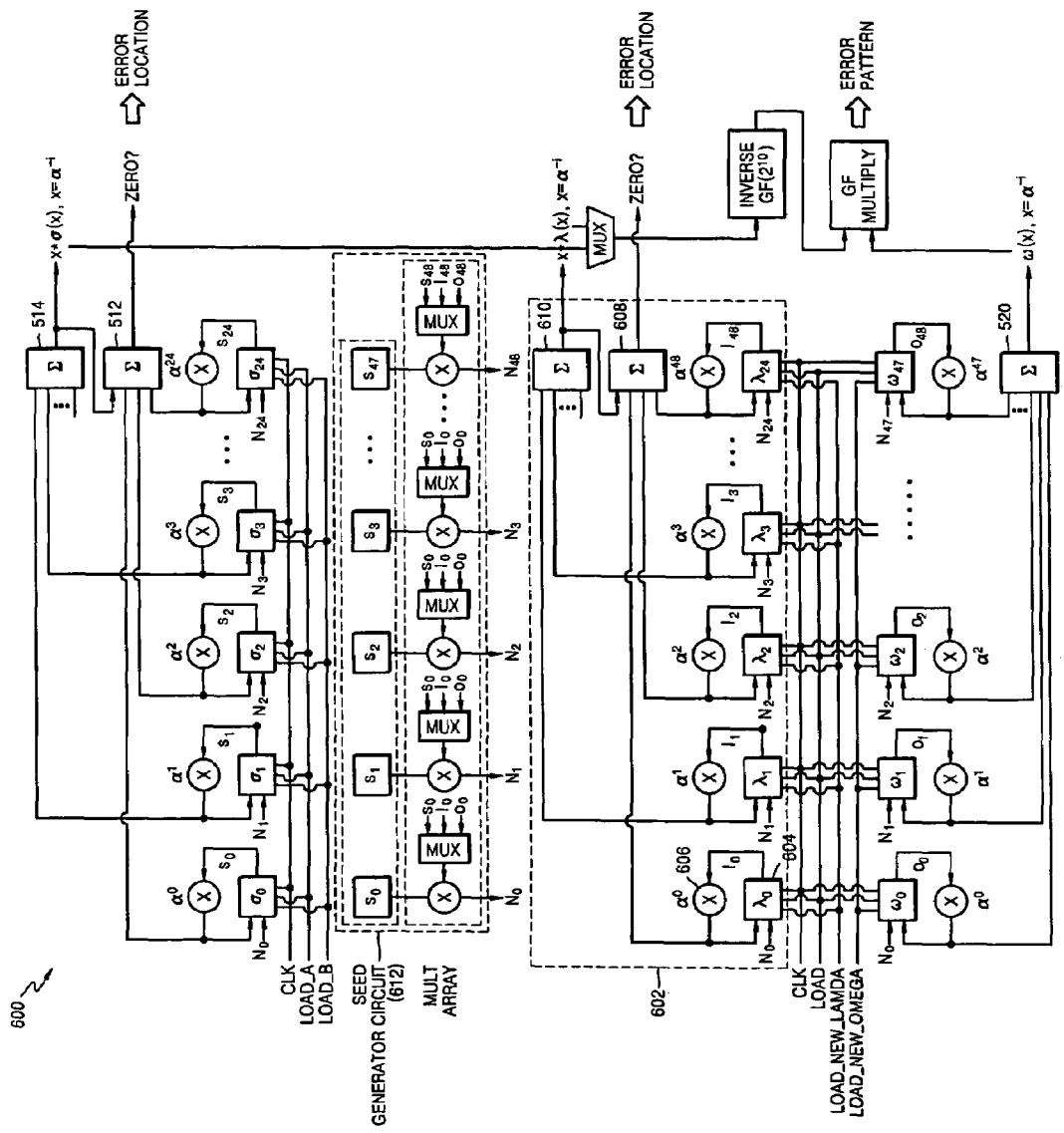
FIG. 6 shows a Reed-Solomon decoder according to another embodiment of the present invention.

FIG. 6 shows a RS decoder according to another embodiment of the invention. In FIG. 6, RS decoder 600 includes the Chien search circuit 502, the Forney algorithm circuit 504 and the seed generator circuit 506 of the RS decoder 500 as previously described, but further includes an erasure mode circuit 602. Erasure mode circuit 602 includes a plurality of adder circuits 604 and a plurality of multiplier circuits 606 and each sub-module has an adder circuit 604 and a multiplier circuit 606. In addition, in order to perform the Forney algorithm and operate in erasure mode at the same time, RS decoder 600 further includes a fourth adder circuit 608 and a fifth adder circuit 160. The fourth adder circuit 608 adds all the order terms of an erasure polynomial $\lambda(x)$ as in the Chien search circuit of FIG. 5. The fifth adder circuit 160 adds only odd-order terms separately.

In the erasure mode circuit 602, RS decoder 600 finds an error symbol location and an erasure symbol location. Each adder circuit 604 loads coefficients $\lambda_0, \lambda_1, \lambda_2, \ldots$ of the erasure polynomial using the erasure polynomial additionally in synchronization with a loading signal (LOAD). Each multiplier circuit 606 loads $x=\alpha^{-i}$ from the seed value generator circuit 612 in synchronization with the loading signal (LOAD), and calculates $(\alpha^{-i})^0, (\alpha^{-i})^1, (\alpha^{-i})^2, (\alpha^{-i})^3, \ldots$ in synchronized whith a clock signal. Each multiplier circuit 606 multiplies the value calculated by substituting $x=\alpha^{-i}$ with the coefficients output from the adder circuits 604 and outputs the multiplication result to the adder circuits 608 and 160. The adder circuit 160 adds only odd-order terms of the erasure polynomial, and the adder 608 adds all the terms of the erasure polynomial.

The roots of the ELP are always treated as error symbols. The roots of the erasure polynomial are treated as erasure symbols only if the roots of the erasure polynomial are not the roots of the ELP. In order to find a final error symbol pattern, the Forney algorithm circuit uses the GF inverse fields.

Figure 7:
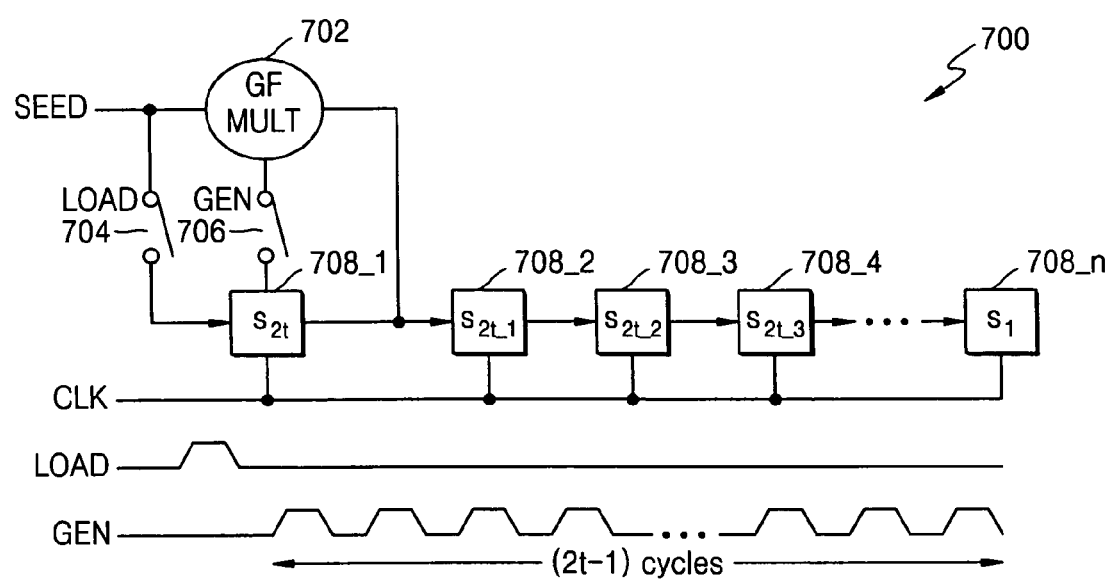
FIG. 7 shows a seed value generator circuit according to another embodiment of the present invention.

FIG. 7 shows a seed value generator circuit according to another embodiment of the invention. Referring to FIG. 7, seed value generator circuit 700 includes a GF multiplier circuit 702, two switches 704 and 706 and a plurality of (2t) flipflops 708_1 to 708_n, where t is a correctable symbol count. If the codeword length of input data is 462, a seed (SEED) is $\alpha^{-461}$ as an initial value of the seed value generator circuit 700. Seed value generator circuit 700 may be connected to the Chien search circuit and Forney algorithm circuit serially or in parallel, or may be loaded therein.

Figure 8:
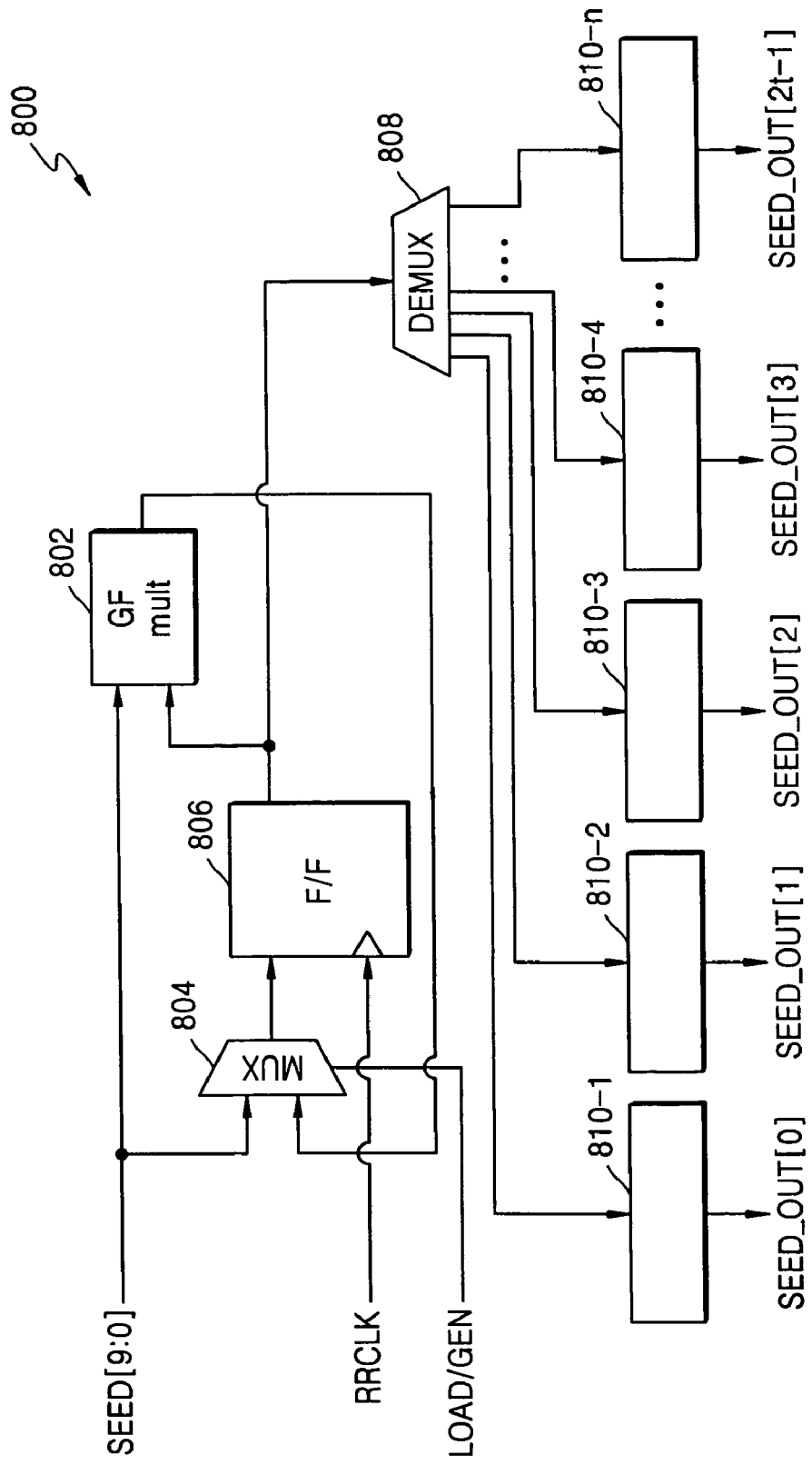
FIG. 8 shows a seed value generator circuit according to another embodiment of the present invention.

FIG. 8 shows a seed value generator circuit according to another embodiment of the invention. Referring to FIG. 8, seed value generator circuit 800 includes a GF multiplier circuit 802, a multiplexer circuit 804, a flipflop 806, a demultiplexer circuit 808 and a plurality of flipflop arrays 810_1 through 810_n.

GF multiplier circuit 802 receives GF value (SEED) corresponding to codeword length, loads the GF value (SEED) and generates a seed value corresponding to codeword length in synchronization with a signal which is output from the flipflop 806 in synchronization with a clock signal (RRCLK). The plurality of flipflop arrays 810_1 through 810_n store the values calculated by seed value generator circuit 800. The values calculated by GF multiplier circuit 804 are stored in flipflop arrays 810_1 through 810_n using de-multiplexer circuit 808 in ascendant order.

Figure 9:
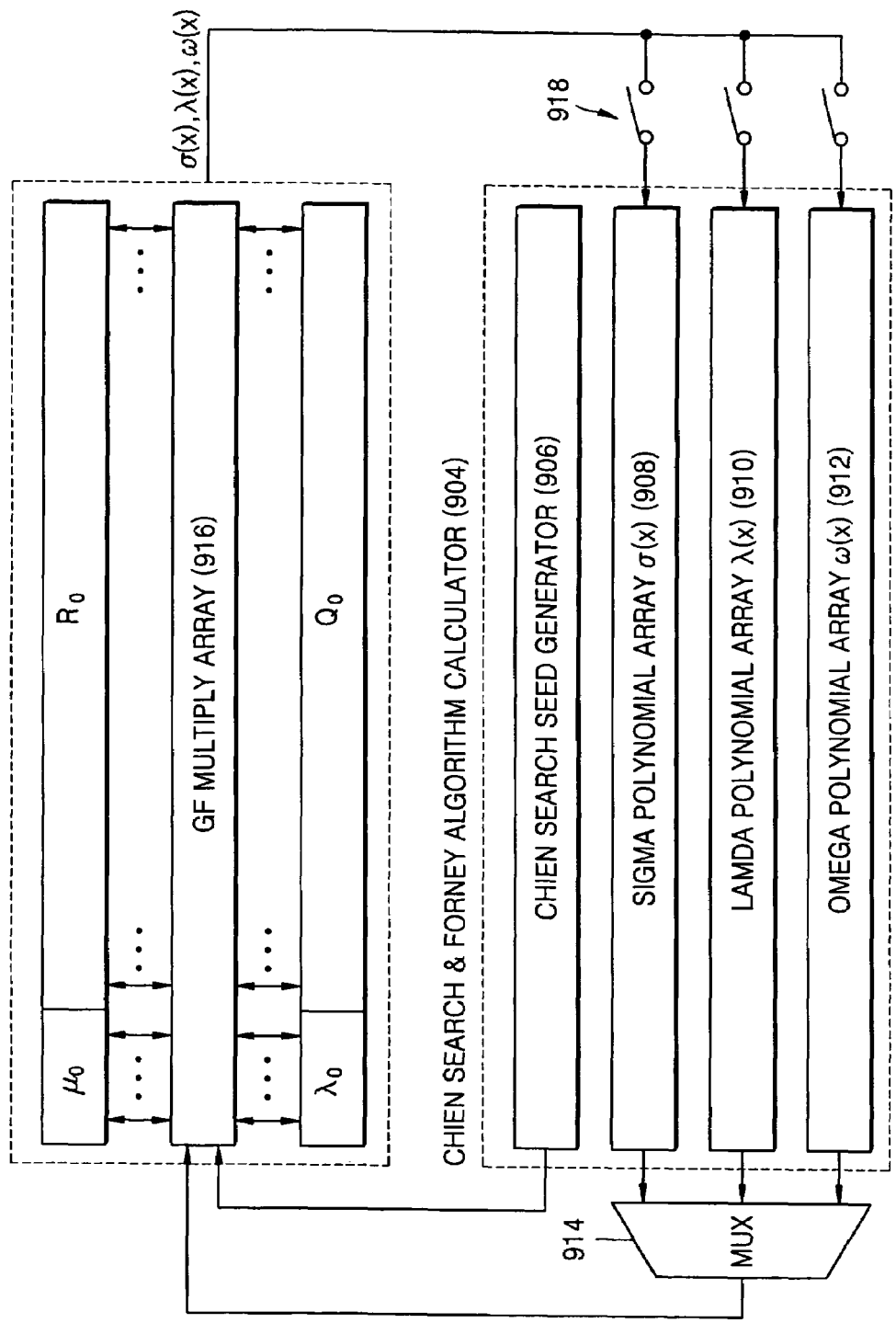
FIG. 9 shows an operation order of a Reed-Solomon decoder according to another embodiment of the present invention.

FIG. 9 illustrates an exemplary operation order for a RS decoder according to another embodiment of the invention. Referring to FIG. 9, RS decoder 900 includes an MEA circuit 902, a Chien search and Forney algorithm circuit 904, a multiplexer 914 and a plurality of switches 918. The Chien search and Forney algorithm circuit 904 includes a seed generator circuit 906, an ELP ($\sigma$) array 908, an erasure polynomial ($\lambda$) array 910 and an EPP ($\omega$) array 912. The three polynomials $\sigma(x), \lambda(x)$ and $\omega(x)$ calculated by MEA circuit 902 are input to Chien search and Forney algorithm circuit 904, and then initial coefficients for polynomials $\sigma(x), \lambda(x)$ and ω(x) are stored in corresponding polynomial arrays 908, 910 and 912, respectively. The initial coefficients form polynomial arrays 908, 910 and 912 are sequentially output through multiplexer 914 to a GF multiplier circuit 916. GF multiplier circuit 916 multiplies coefficients stored in the polynomial array with corresponding seed values generated by the seed value generator 906 in order to calculate new coefficients. Finally, an error location and error pattern are found and error correction is performed in relation to the error location and/or error pattern.

According to embodiments of a RS decoder implemented in accordance the invention, when initial coefficients for the Chien search circuit are set, and the Chien search is performed, the Chien search can be performed in an input order of codeword. Accordingly, a CRC operation to be performed later can be performed for an error pattern whenever an error location is generated. Therefore, if the CRC operation is performed according to the method of the present invention, the CRC operation can be ended after one cycle from the Chien search.

Figure 10:
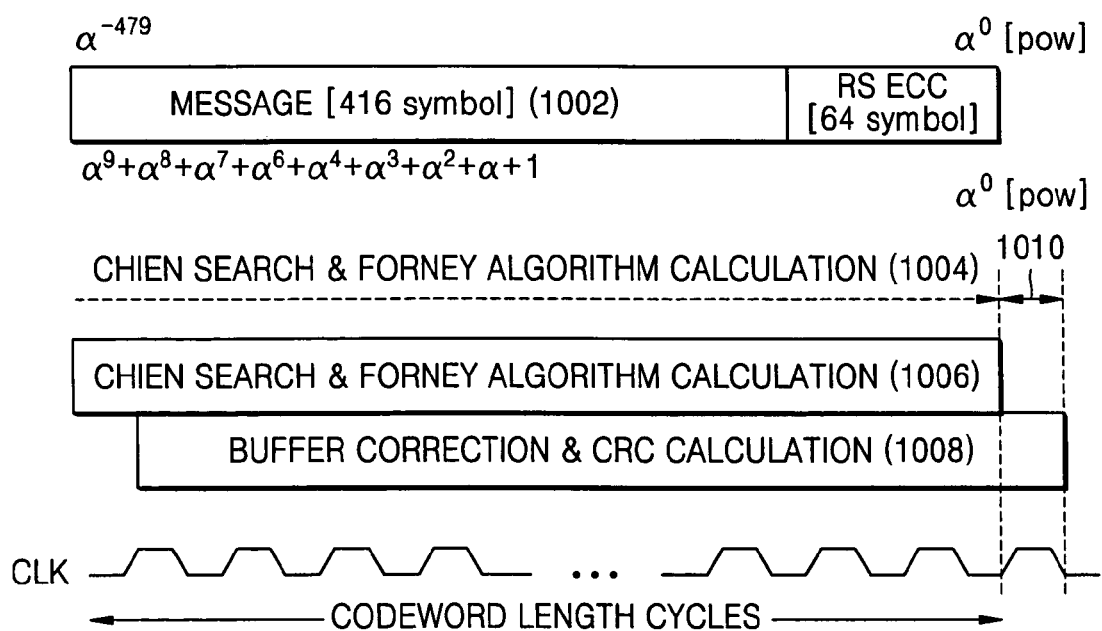
FIG. 10 shows a timing relation between a Chien search and CRC operation according to another embodiment of the present invention.

FIG. 10 shows an exemplary timing relation between a Chien search and CRC operation according to another embodiment of the invention. Referring to FIG. 10, Chien search 1006 is performed on input data 1002 in a forward direction 1004. As a result, whenever an error pattern value for an error location is generated in the Chien search, the error pattern value is input in a CRC decoder so that a CRC operation 1008 can be performed at the same time that the Chien search is performed. Accordingly, the difference between a Chien search and Forney algorithm operation 1006 and the CRC operation 1008 is one cycle 1010 and can be ended immediately. Since the directions of the CRC operation and the Chien operation are the same as an input order of a data message, an error location and an error pattern do not have to be stored additionally.

According to an exemplary RS decoding method according to the invention, when the Chien search is performed, since proper coefficients corresponding to codeword length are used as initial coefficients, the Chien search is performed in an input order of data so that time required to perform a subsequent CRC decoding following the RS decoding may be reduced. If this method is used, whenever an error pattern value for an error location is generated in the Chien search, the error pattern value is input to the CRC decoder such that a CRC operation can be performed at the same time that the Chien search is performed. Since the computational directions of the CRC operation and the Chien operation are the same as an input order of a message, an error location and an error pattern do not have to be additionally stored.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A Reed-Solomon decoder, comprising:
   a Chien search circuit to receive an error location polynomial function, perform a Chien search, and find an error location;
   a Forney algorithm circuit to receive an error pattern polynomial function and find an error pattern by application of a Forney algorithm; and
   a seed generator circuit to indicate a seed value corresponding to a codeword length for input data when the Chien search is performed, and to thereby obtain and output exponential terms related to variables associated with the polynomials defining at least one of the error location polynomial function and the error pattern polynomial function,
   wherein the Chien search is performed in the same computational direction as an order of the input data.

2. The Reed-Solomon decoder of claim 1, wherein the seed generator circuit is connected to the Chien search circuit and the Forney algorithm circuit in parallel or serially.

3. The Reed-Solomon decoder of claim 1, wherein the seed value output by the seed generator circuit and polynomial arrays output by the Chien search circuit and the Forney algorithm circuit are sequentially multiplied by a Galois Field (GF) multiplier circuit.

4. The Reed-Solomon decoder of claim 3, wherein operation of the GF multiplier circuit obtains the exponential terms related to the variables associated with the polynomials.

5. The Reed-Solomon decoder of claim 3, further comprising:
   a modified Euclid algorithm (MEA) circuit comprising the GF multiplier circuit.

6. The Reed-Solomon decoder of claim 3, wherein the Chien search circuit and the Forney algorithm circuit respectively multiply a calculation value obtained by the seed generator circuit by polynomial coefficients corresponding to an array of the calculation values in the same computational direction as the input order of the codeword to obtain multiplication results, and thereafter set the multiplication results as a new coefficients for data input to the Chien search circuit and the Forney algorithm circuit, to thereby obtain an error location and an error pattern in a forward direction.

7. The Reed-Solomon decoder of claim 3, further comprising:
   a multiplexer to selectively output an error location polynomial array, an error pattern polynomial array, and an erasure polynomial array.

8. The Reed-Solomon decoder of claim 7, wherein the GF multiplier circuit multiplies one of the error location polynomial array, the error pattern polynomial array and the erasure polynomial array by a corresponding seed value to determine an error pattern.

9. The Reed-Solomon decoder of claim 3, further comprising:
   an inverse GF circuit to obtain and output an inverse of the seed value, wherein the GF multiplier circuit obtains the error pattern using the inverse seed value.

10. A Reed-Solomon decoder, comprising:
    a syndrome generator circuit to generate a syndrome polynomial from input data;
    an erasure generator circuit to receive the syndrome polynomial and a TA flag and to generate an erasure polynomial;
    an modified Euclid algorithm (MEA) circuit to receive the syndrome polynomial and the erasure polynomial, and to output an error location polynomial function and an error pattern polynomial function;
    a Chien search circuit to receive the error location polynomial function, to perform a Chien search, and find an error location;
    a Forney algorithm circuit to receive the error pattern polynomial function and find an error pattern by application of a Forney algorithm; and
    a seed generator circuit to generate a Galois Field (GF) value when the Chien search is performed, and indicate a seed value corresponding to a codeword length.

11. The Reed-Solomon decoder of claim 10, wherein the seed generator circuit comprises a GF multiplier circuit that sequentially multiplies the seed value, such that the seed generator circuit obtains exponential terms related to variables associated with the polynomials.

12. The Reed-Solomon decoder of claim 11, wherein the Chien search circuit multiplies a calculation value obtained by the seed generator circuit with coefficients derived from the error location polynomial corresponding to an array of the calculation values in the same computational direction as an input order of the codeword in order to obtain an error location.

13. The Reed-Solomon decoder of claim 11, wherein the Forney algorithm circuit multiplies a calculation value obtained by the seed generator circuit with coefficients derived from the error pattern polynomial corresponding to an array of the calculation values in the same computational direction as an input order of the codeword in order to obtain an error pattern.

14. An error check and correction circuit, comprising:
a Reed-Solomon decoder including a Chien search circuit, a Forney algorithm circuit and a seed generator circuit; and
a cyclic redundancy check (CRC) operator circuit to determine miss-correction of an error by the Reed-Solomon decoder,
wherein the Chien search circuit receives an error location polynomial function, performs Chien search, and finds an error location;
the Forney algorithm circuit receives an error pattern polynomial function, and finds an error pattern by application of a Forney algorithm; and
the seed generator circuit providing a seed value corresponding to a codeword length for input data when the Chien search is performed, and obtaining and outputting exponential terms for polynomials associated with at least one of the error location polynomial function and the error pattern polynomial function,
wherein the Chien search is performed in the same computational direction as an order for the input data; and
whenever an error pattern value for an error location is generated in the Chien search, the error pattern value is input to the Chien search so that a CRC operation is simultaneously performed.

15. The error check correction circuit of claim 14, wherein the seed generator circuit comprises a Galois Field (GF) multiplier circuit that repeats multiplication from the seed value, so that the seed generator circuit obtains exponential terms of variables of the polynomials; and
wherein the seed value output by the seed generator circuit and polynomial arrays output by the Chien search circuit and the Forney algorithm circuit are sequentially and respectively multiplied by coefficients of the polynomial using the GF multiplier circuit.

16. The error check correction circuit of claim 14, wherein, upon execution of the Chien search and application of the Forney algorithm, a calculated error location and a calculated error pattern are immediately input to a CRC decoder such that the Chien search and CRC operation are simultaneously performed.

17. A method of checking and correcting an error in input data, the method comprising:
generating an error location polynomial from the input data;
generating an error pattern polynomial from the input data;
sequentially multiplying a seed value corresponding to a codeword related to the input data, and calculating variable terms of the polynomials;
performing a Chien search based on the error location polynomial and the seed value to obtain an error location;
applying a Forney algorithm in relation to the error pattern polynomial and the seed value to obtain an error pattern; and
correcting the error in the input data in relation to the error location and the error pattern.

18. The method of claim 17, further comprising:
performing a CRC operation using the error location and the error pattern.

19. The method of claim 17, wherein the Chien search is performed in the same computational direction as an received direction for the input data.

20. A method of implementing Reed-Solomon (RS) coding, comprising:
performing cyclic redundancy check (CRC) following RS decoding;
wherein the RS decoding comprises sequentially multiplying a seed value corresponding to a codeword related to the input data, and calculating variable terms of an error location polynomial; and
performing a Chien search based on the based on the error location polynomial and the seed value.

21. The method of claim 20, wherein the Chien search and the CRC operation are executed simultaneously.

* * * * *